(12) United States Patent
Mcreynolds et al.

(10) Patent No.: US 12,724,111 B2
(45) Date of Patent: Sep. 1, 2026

(54) BEND COMPENSATION FOR MOLDED WAVEGUIDE ANTENNAS

(71) Applicant: Aptiv Technologies AG, Schaffhausen (CH)

(72) Inventors: Kevin Mcreynolds, Noblesville, IN (US); Dennis C. Nohns, Kokomo, IN (US); Roshin Rose George, Carmel, IN (US); Yuxiao He, Carmel, IN (US)

(73) Assignee: Aptiv Technologies AG, Schaffhausen (CH)

( * ) Notice: Subject to any disclaimer, the term of this patent is extended or adjusted under 35 U.S.C. 154(b) by 270 days.

(21) Appl. No.: 18/532,575

(22) Filed: Dec. 7, 2023

(65) Prior Publication Data

US 2025/0189624 A1 Jun. 12, 2025

(51) Int. Cl.

| | |
|---|---|
| ***G01S 7/03*** | (2006.01) |
| ***G01S 7/02*** | (2006.01) |
| ***H05K 1/02*** | (2006.01) |

(52) U.S. Cl.

CPC ............ *G01S 7/032* (2013.01); *H05K 1/0243* (2013.01); *G01S 7/028* (2021.05); *H05K 2201/10098* (2013.01)

(58) Field of Classification Search

CPC ....... G01S 7/032; G01S 7/028; H05K 1/0243; H05K 2201/10098; H05K 1/18; H01P 1/025; H01P 5/107; H01P 1/16; H01P 1/162; H01P 3/123; H01P 5/024; H01P 1/02; H01Q 13/02; H01Q 1/3233; H01Q 1/36; H01Q 1/24; H01Q 1/38

See application file for complete search history.

(56) References Cited

U.S. PATENT DOCUMENTS

| | | | | |
|---|---|---|---|---|
| 2007/0075801 A1* | 4/2007 | Okano | H01Q 13/06 333/256 |
| 2023/0119711 A1* | 4/2023 | He | H05K 1/025 343/866 |
| 2023/0282983 A1 | 9/2023 | Kim et al. | |

FOREIGN PATENT DOCUMENTS

WO 2022122319 A1 6/2022

OTHER PUBLICATIONS

Extended European Search Report regarding European Patent Application No. 24178255.6, dated Oct. 28, 2024.

* cited by examiner

*Primary Examiner* — Resha Desai
*Assistant Examiner* — Naomi M Wolford
(74) *Attorney, Agent, or Firm* — Harness, Dickey & Pierce, P.L.C.

(57) ABSTRACT

A radio frequency (RF) system includes a control printed circuit board (PCB) configured to generate RF signals. A waveguide antenna is attached to the control PCB and includes an input channel that receives RF signals along a first axis. A bend transition chamber receives the RF signals from the input channel and routes the RF signals to a waveguide channel. The waveguide channel receives the RF signals along a second axis orthogonal to the first axis and routes the RF signals to the radiator, which transmits the RF signals outside of the RF system. The bend transition chamber includes a stub chamber having a width along a third axis orthogonal to both the first axis and the second axis that is greater than a width of the input channel along the third axis and greater than a width of the waveguide channel along the third axis.

12 Claims, 11 Drawing Sheets

BEND COMPENSATION FOR MOLDED WAVEGUIDE ANTENNAS

FIELD

The present disclosure relates to molded waveguide antennas, including molded waveguide antennas that include bend compensation for the transition from the vertical waveguide input from a printed circuit board (PCB) to the horizontal waveguide channel that provides routing to a radiator of the antenna, such as waveguide antennas for radio frequency (RF) systems that include a transmitter and/or a receiver.

BACKGROUND

This section provides background information related to the present disclosure which is not necessarily prior art.

Some radio frequency systems (RF), such as automotive radar systems and/or communication systems, use printed circuit board (PCB) antennas wherein the RF system includes a control PCB that includes processing components for the system, such as one or more microprocessors, one or more power supplies, other integrated circuits (ICs), etc., as well as an additional antenna PCB attached to the control PCB. The additional antenna PCB is made of high-performance RF material and includes antenna components that function as the antenna for the radar system. The PCB antenna radiators, for example, can be implemented using microstrip patches, microstrip stubs, microstrip meander lines, etc. The antenna PCB can be attached to the control PCB using adhesive.

Alternatively, in other configurations some prior systems include RF material on the control PCB itself that functions as the antenna for the radar system without the use of an additional antenna PCB.

A waveguide antenna can be used in place of the PCB type antenna for an RF system. For example, molded waveguide components can be attached to the control PCB. The molded waveguide components can include an input bend interface to guide RF energy received from vertical input channels connected to the control PCB to horizontal waveguide channels that route the RF energy to radiator outputs of the radar antenna.

The right-angle bend at the transition from the vertical input channel to the horizontal waveguide channel, however, can cause a loss of radar RF signal power due to reflected power at the right-angle bend. With reference to FIGS. 11A to 11D, prior systems have attempted to decrease the loss of power cause by the right-angle bend by adding a chamfer or radius to the outside edge of the bend, which reduces the width of the waveguide, in an attempt to transition more of the RF energy from the vertical input channel to the horizontal waveguide channel. For example, FIG. 11A illustrates an angled chamfer at the outside edge of the bend, which reduces capacitance in the corner of the right-angle bend. FIG. 11B illustrates a curved outside edge of the bend, with the radius curve of the outside edge being greater than the width of the vertical and horizontal channels. FIG. 11C illustrates a curved outside edge of the bend having a radius that is similar to the width of the vertical and horizontal channels. FIG. 11D illustrates a bend having both curved inside and outside edges to transition RF power from the vertical input of the control PCB to the horizontal channel of the waveguide.

In waveguide antennas comprised of molded components, when the waveguide is oriented with the split between the top and bottom halves at the midpoint of the waveguide E-plane, minimal power is lost due to the inevitable gap between the components. In RF systems, the E-plane refers to the plane containing the electric field vector and the direction of maximum radiation. The E-plan is 90 degrees apart from the H-plane, which is the plane containing the magnetic field vector. Using a chamfer or curved radius within the right-angle bend can render the molded components of the waveguide to be non-symmetrical, which results in power loss. Conductive paste or solder can be used to attach the two molded parts of the waveguide together, but the use of conductive paste or solder to attach the molded components together results in increased costs. Alternatively, some prior systems have utilized an iris within the vertical input channel to decrease a width of a portion of the vertical input channel. In this way, the iris restricts and reduces the width of a small portion of the input channel of the waveguide to create a capacitance or an inductance that partially negates the effect of the right-angle bend. The iris approach with the reduced width area of the vertical channel, however, requires particular manufacturing tolerances that can be difficult to fabricate with molded components.

SUMMARY

This section provides a general summary of the disclosure and is not a comprehensive disclosure of its full scope or all of its features.

A radio frequency (RF) system is provided and includes a control printed circuit board (PCB) that includes a processor and a transmitter configured to generate RF signals and a waveguide antenna attached to the control printed circuit board. The waveguide antenna includes an input channel, a bend transition chamber, a waveguide channel, and a radiator. The input channel is configured to receive the RF signals from the control PCB along a first axis. The bend transition chamber is configured to receive the RF signals from the input channel and to route the RF signals to the waveguide channel. The waveguide channel is configured to receive the RF signals from the bend transition chamber along a second axis orthogonal to the first axis and to route the RF signals to the radiator. The radiator being configured to transmit the RF signals outside of the RF system. The bend transition chamber includes a stub chamber having a width along a third axis orthogonal to both the first axis and the second axis that is greater than a width of the input channel along the third axis and greater than a width of the waveguide channel along the third axis.

In other features, the waveguide antenna includes an upper waveguide part and a lower waveguide part that are each formed by a molding process.

In other features, the upper waveguide part includes an upper chamber and the lower waveguide part includes a lower chamber such that the bend transition chamber is formed by the upper and lower chambers when the upper and lower waveguide parts are assembled together.

In other features, the upper and lower chambers are symmetrical along a plane formed by the second and third axes.

In other features, the upper waveguide part includes an upper waveguide portion and the lower waveguide part includes a lower waveguide portion such that the waveguide channel is formed by the upper and lower waveguide portions when the upper and lower waveguide parts are assembled together.

In other features, the upper and lower waveguide portions are symmetrical along a plane formed by the second and third axes.

In other features, the upper and lower waveguide parts are assembled together in the automotive radar system without conductive paste and without solder.

In other features, the stub chamber includes a first bumpout that extends from a first sidewall of the bend transition chamber along the third axis and a second bumpout that extends from a second sidewall, opposite from the first sidewall, of the bend transition chamber.

In other features, the first and second bumpouts extend from the first and second sidewalls, respectively, by an equal distance.

In other features, the first and second bumpouts extend from the first and second sidewalls, respectively, by different distances.

In other features, the stub chamber includes only a bumpout that extends from a first sidewall of the bend transition chamber along the third axis and a second sidewall, opposite from the first sidewall, does not include a bumpout.

In other features, the PCB and waveguide antenna are included in an automotive radar system configured to transmit and receive radar signals.

Another radio frequency (RF) system is provided and includes a control printed circuit board (PCB) that includes a processor and a transmitter configured to generate RF signals and a waveguide antenna attached to the control printed circuit board. The waveguide antenna includes an input channel, a bend transition chamber, a waveguide channel, and a radiator. The input channel is configured to receive the RF signals from the control PCB along a first axis. The bend transition chamber is configured to receive the RF signals from the input channel and to route the RF signals to the waveguide channel. The waveguide channel is configured to receive the RF signals from the bend transition chamber along a second axis orthogonal to the first axis and to route the RF signals to the radiator. The radiator is configured to transmit the RF signals outside of the RF system. The bend transition chamber includes a stub chamber having a width along a third axis orthogonal to both the first axis and the second axis that is greater than a width of the input channel along the third axis and greater than a width of the waveguide channel along the third axis. The waveguide antenna includes an upper waveguide part and a lower waveguide part that are each formed by a molding process. The upper waveguide part includes an upper chamber and the lower waveguide part includes a lower chamber such that the bend transition chamber is formed by the upper and lower chambers when the upper and lower waveguide parts are assembled together. The upper waveguide part includes an upper waveguide portion and the lower waveguide part includes a lower waveguide portion such that the waveguide channel is formed by the upper and lower waveguide portions when the upper and lower waveguide parts are assembled together. The upper and lower waveguide parts are assembled together in the automotive radar system without conductive paste and without solder.

In other features, the stub chamber includes a bumpout that extends from a sidewall of the bend transition chamber along the third axis.

In other features, the stub chamber includes a first bumpout that extends from a first sidewall of the bend transition chamber along the third axis and a second bumpout that extends from a second sidewall, opposite from the first sidewall, of the bend transition chamber, with the first and second bumpouts extending from the first and second sidewalls, respectively, by an equal distance.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments, not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

The present disclosure is directed to waveguide antennas for RF systems, including, for example, automotive radar systems, communication systems, etc., that include bend compensation for the transition from a vertical waveguide input channel that extends from an RF input of a printed circuit board (PCB) to a horizontal waveguide channel that provides routing of the RF signals from the input channel to one or more radiators of the antenna. The bend compensation includes a vertical-to-horizontal bend transition chamber that includes a stub chamber with sidewalls that bump out from the bend transition chamber to extend outwardly such that the width of the bend transition chamber within the stub chamber is greater than the width of the vertical input channel and greater than the width of the horizontal waveguide channel. The wider stub chamber at the junction/transition interface of the bend transition chamber provides technical advantages over prior systems, including better RF performance loss and larger bandwidth capabilities, as compared with prior systems. As discussed in further detail below, the wider stub chamber at the junction/transition interface also does not have the fabrication and manufacturing limitations imposed by the tight tolerances of the prior iris approach, which utilizes a narrowing of the vertical chamber walls. As discussed in further detail below, the waveguide antenna of the present disclosure is comprised of two molded pieces that are symmetric across the horizontal waveguide centerline, resulting in low leakage without requiring the use of conductive paste of solder to secure the two molded pieces together. In this way, the use of a wider stub chamber at the vertical-to-horizontal junction/transition interface of the waveguide between the vertical input channel from the control PCB to the horizontal waveguide channel that routes the RF to the radiators of the radar antenna increases the amount of RF power transmitted from the control PCB through the junction/transition interface to the horizontal waveguide channel and ultimately to the radiators of the radar antenna.

Figure 1:
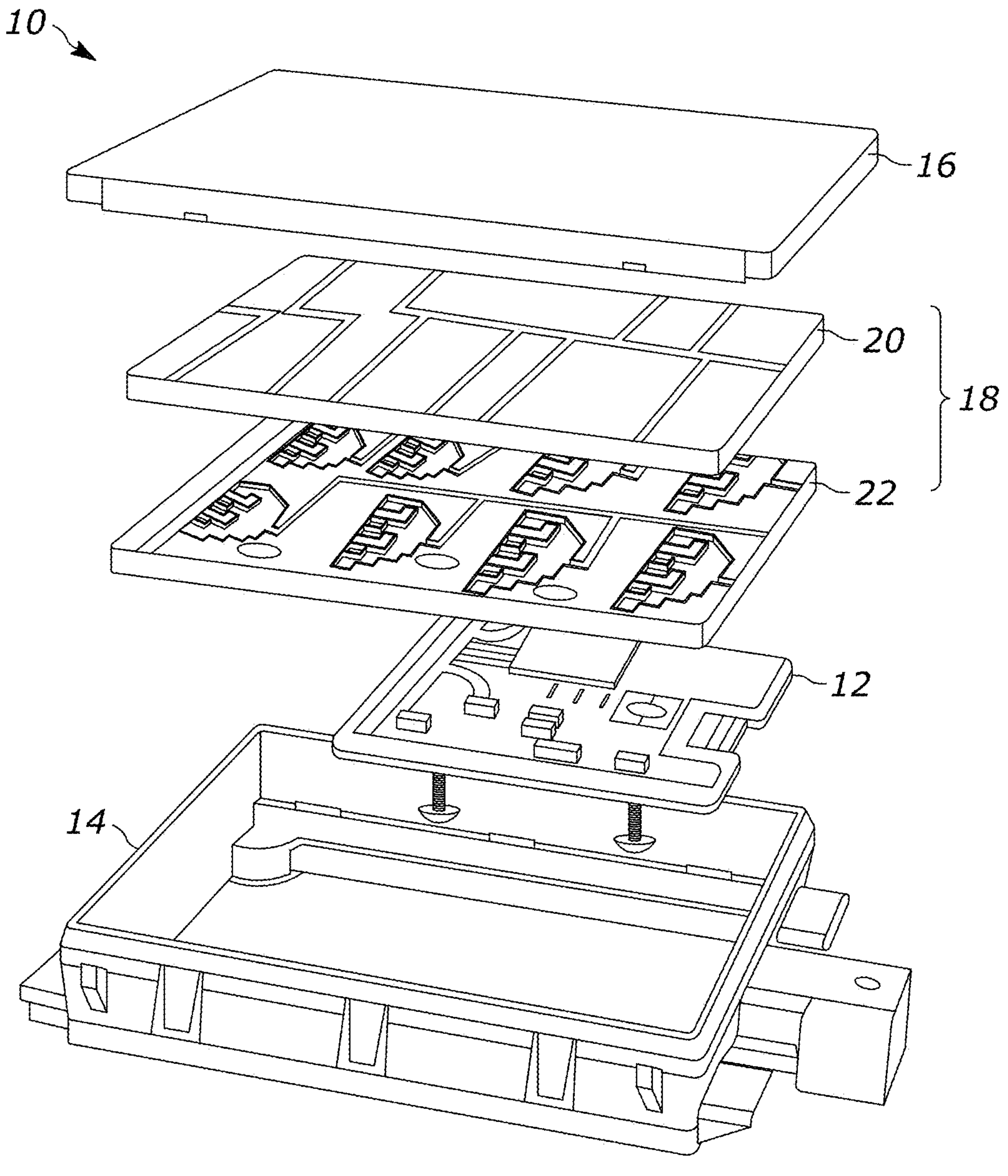
FIG. 1 is an exploded view of a radar system in accordance with the present disclosure.
Figure 2:
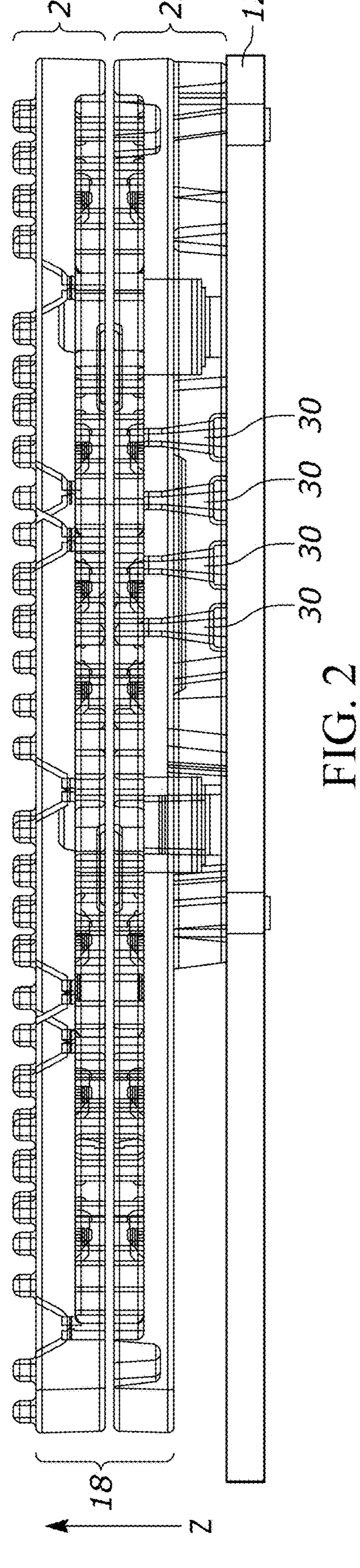
FIG. 2 is cross-section view of a radar system in accordance with the present disclosure.

With reference to FIGS. 1 and 2, a radar system 10 is illustrated and includes a control PCB 12 that includes processing components for the radar system 10, such as one or more microprocessors, one or more power supplies, other integrated circuits (ICs) with one or more transmitter(s), one or more receiver(s), etc., used to generate and transmit RF radar signals used to detect objects in an environment of a vehicle. While the radar system 10 is provided as an example, the molded waveguide antenna of the present disclosure can be utilized with other RF systems that include a transmitter and/or receiver, such as a communication system. The radar system 10 includes a lower housing 14 and an upper housing 16 that, when assembled, house the components of the radar system 10. The radar system 10 includes a waveguide antenna 18 housed within the lower housing 14 and upper housing 16 once assembled. The waveguide antenna 18 is comprised of two pieces or halves including an upper waveguide part 20 and a lower waveguide part 22.

The upper and lower waveguide parts 20, 22 of the waveguide antenna 18 are molded parts assembled together without conductive paste or solder. As shown in FIG. 2, a side view of the waveguide antenna 18 illustrates that the upper and lower waveguide parts 20, 22 are configured such that the waveguide antenna 18 is split along a horizontal plane of the routing of the waveguide antenna 18 to minimize leakage in the presence of any gaps between the upper and lower waveguide parts 20, 22. The lower waveguide part 22 of the waveguide antenna 18 is attached to the control PCB 12 and includes vertical input channels 30 that receive RF signals from the control PCB 12. As discussed in further detail below, the vertical input channels 30 are connected to bend transition chambers that route the RF signals received from the control PCB 12 to horizontal waveguide channels that further route the RF signals to the radiators of the waveguide antenna 18.

Figure 3:
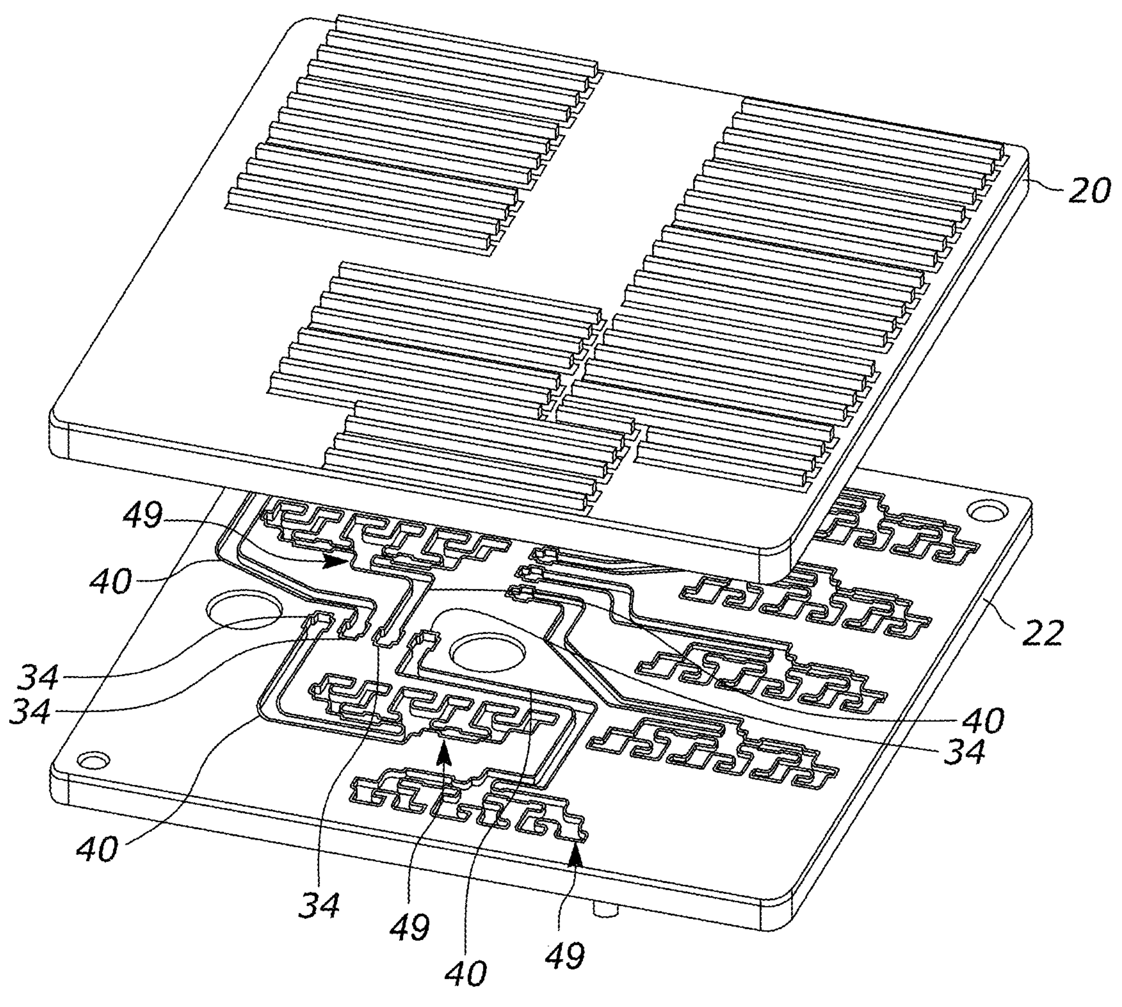
FIG. 3 is a perspective view of a waveguide antenna in accordance with the present disclosure.

With additional reference to FIG. 3, an exploded view of the waveguide antenna 18 is shown and illustrates upper sides of each of the upper and lower waveguide parts 20, 22. With additional reference to FIG. 4, a lower side of the upper waveguide part 20 is illustrated. The upper and lower waveguide parts 20, 22 are configured such that matching halves of the corresponding waveguide channels are routed through each of the upper and lower waveguide parts 20, 20 so that the waveguide channels are formed by the matching halves when the upper and lower waveguide parts 20, 22 are assembled together. Each vertical input channel 30, for example, leads to a bend transition chamber 36 (shown in FIGS. 5 and 6). An upper chamber 32 of the bend transition chamber 36 is formed in the upper waveguide part 20 and a lower chamber 34 of the bend transition chamber 36 is formed in the lower waveguide part 20. When the upper and lower waveguide parts 20, 22 are assembled together, the upper and lower chambers 32, 34 form the bend transition chamber 36. The bend transition chamber 36 directs RF power from the vertical input channel 30 into a horizontal waveguide channel 42 (shown in FIGS. 5 and 6). The horizontal waveguide channel 42 is formed by an upper waveguide portion 38 formed in the upper waveguide part 20 and a lower waveguide portion 40 formed in the lower waveguide part 22. When the upper and lower waveguide parts 20, 22 are assembled together, the upper and lower waveguide portions 38, form the horizontal waveguide channel 42.

Figure 4:
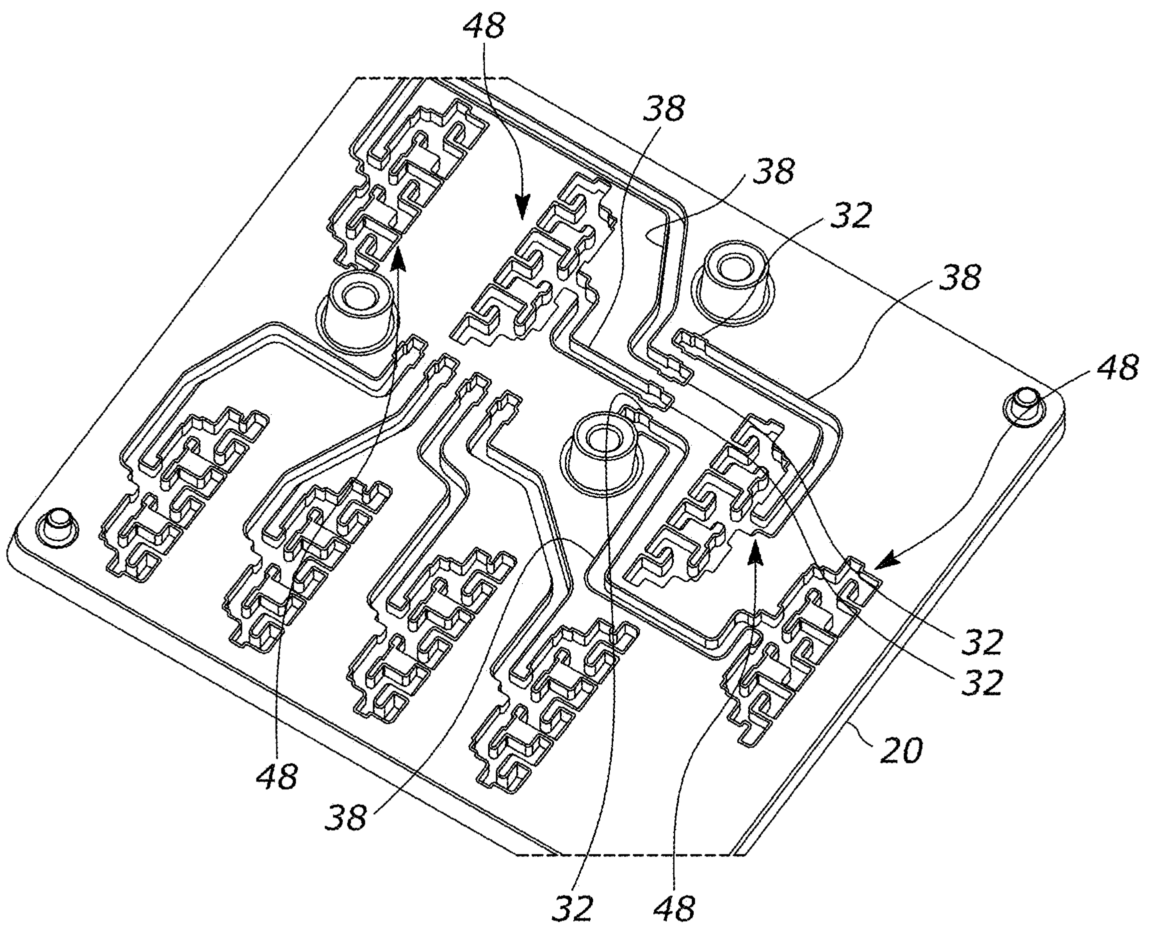
FIG. 4 is a perspective view of an upper waveguide part of a waveguide antenna in accordance with the present disclosure.

With reference again to FIG. 3, the upper side of the lower waveguide part 22 is shown, illustrating a number of lower chambers 34 and a number of the lower waveguide portions 40. With reference to FIG. 4, a lower side of the upper waveguide part 20 is shown, illustrating a number of upper chambers 32 and a number of upper waveguide portions 38. When the upper side of the lower waveguide part 22 is mated with and attached to the lower side of the upper waveguide part 20, each upper chamber 32 and mated lower chamber 34 form a bend transition chamber 36 (shown in FIGS. 5 and 6) and each upper waveguide portion 38 and mated lower waveguide portion 40 form a horizontal waveguide channel 42 (shown in FIGS. 5 and 6).

Each of the horizontal waveguide channels 42 leads to a radiator that emits radar RF from the radar system 10 outwardly to objects within an environment of the vehicle. Similar to the bend transition chambers 36 and horizontal waveguide channels 42, each radiator includes an upper radiator portion 48 (shown in FIG. 4) and a lower radiator portion 49 (shown in FIG. 3).

Figure 5:
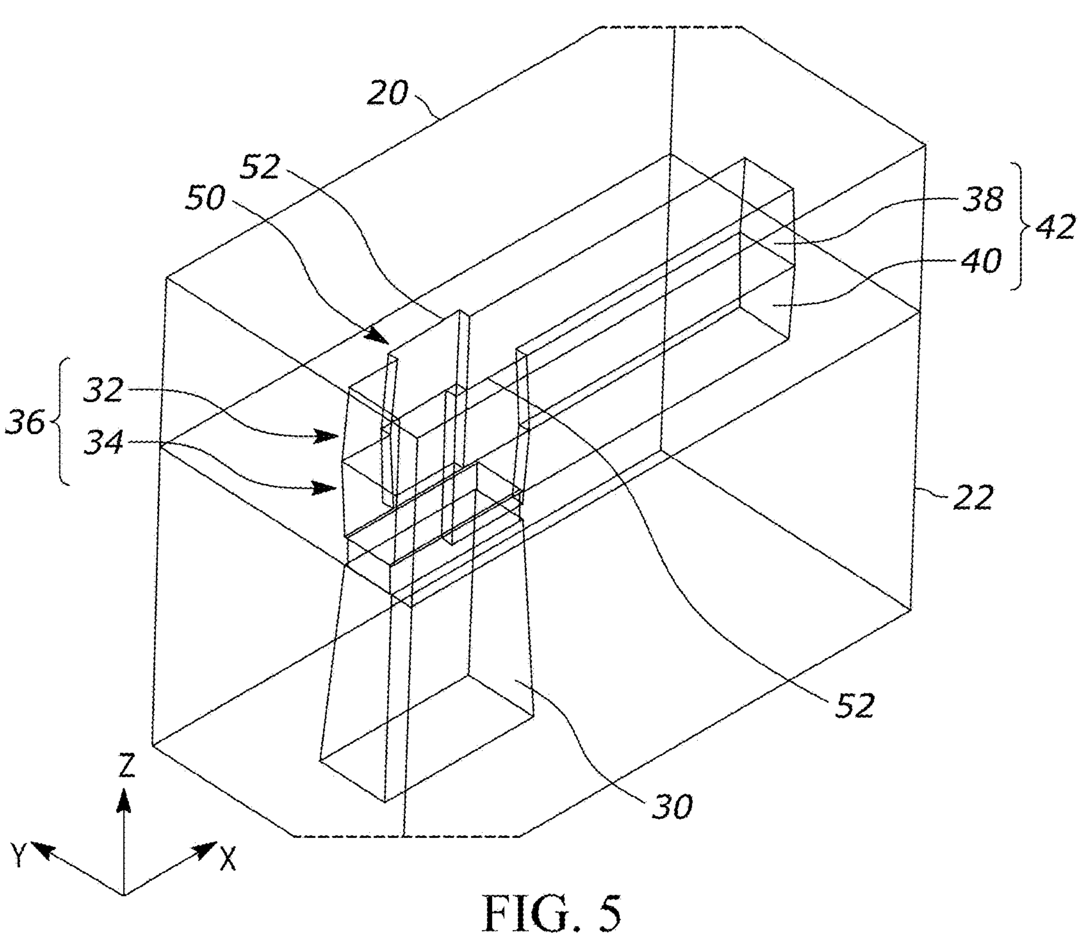
FIG. 5 illustrates an input channel, bend transition chamber, and waveguide channel of a waveguide antenna in accordance with the present disclosure.
Figure 6:
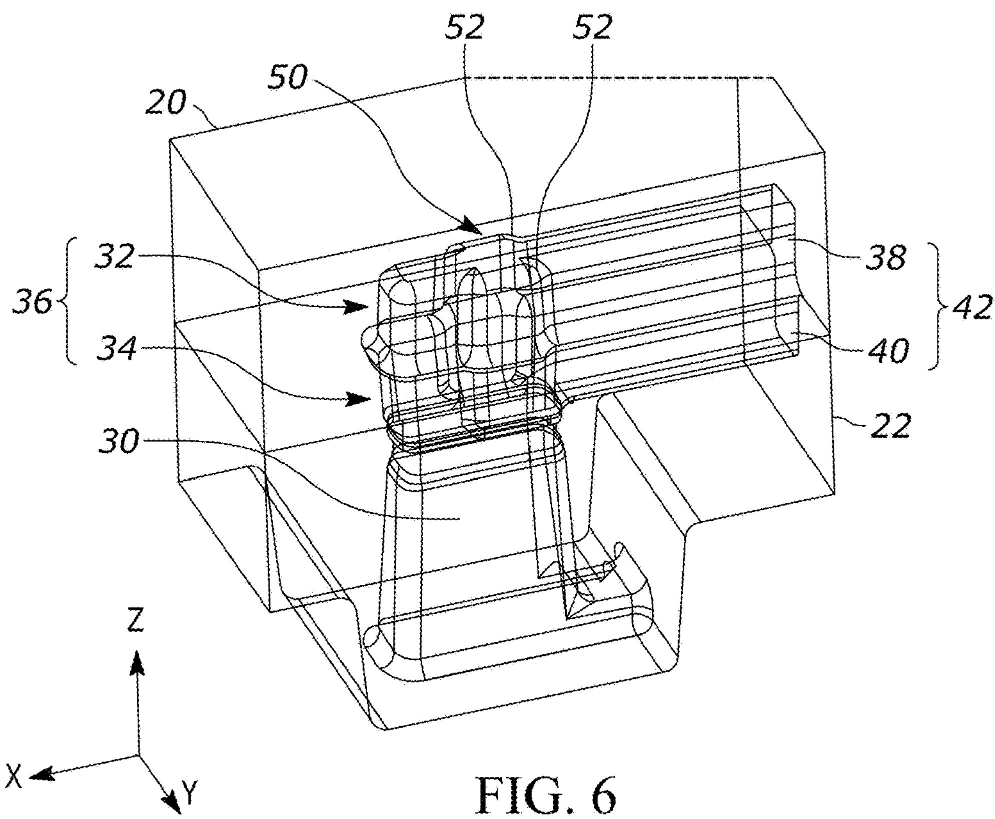
FIG. 6 illustrates an input channel, bend transition chamber, and waveguide channel of a waveguide antenna in accordance with the present disclosure.
Figure 7:
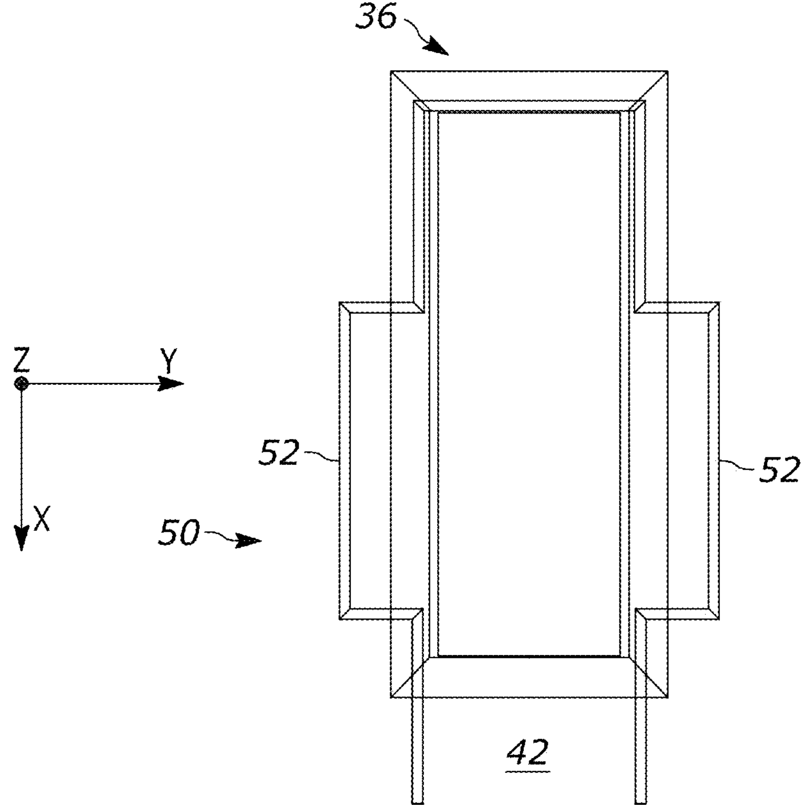
FIG. 7 is a top view of a bend transition chamber of a waveguide antenna in accordance with the present disclosure.

With reference to FIGS. 5-7, RF power is transmitted from the control PCB 12 into the vertical input channel 30. In FIGS. 5-7, the vertical direction corresponding to the direction in which the RF power is transmitted from the control PCB 12 into the vertical input channel is designated as the z-axis. The RF power is then routed from the vertical input channel 30 into the bend transition chamber 36 where it is routed and transitioned into the horizontal waveguide channel 42. The direction of RF power being transmitted through the horizontal waveguide channel 42 is designated in FIGS. 5-7 as the x-axis. In this way, RF power transmitted from the control PCB 12 is routed into the vertical input channel 30 and then routed through a right-angle transition from the z-axis to the x-axis via the bend transition chamber 36 into the horizontal waveguide channel 42. The RF power is then routed via the horizontal waveguide channel 42 to a corresponding radiator of the radar system 10, as described above.

In one implementation, the bend transition chamber 36 includes a stub chamber 50 formed by bumpouts 52 in opposing walls of the bend transition chamber 36. The stub chamber 50 is formed along at least a portion of the bend transition chamber such that the width of the stub chamber 50 in a y-axis direction, which is orthogonal to both the x-axis and the y-axis, is greater than a width of the vertical input channel 30 in the y-axis direction and a width of the horizontal waveguide channel 42 in the y-axis direction. In other words, the stub chamber 50 is wider than both the horizontal waveguide channel 42 and the vertical input channel 30 in a direction that is orthogonal to both the direction of RF power being transmitted through the vertical input channel 30 and the direction of RF power being transmitted through the horizontal waveguide channel 42.

As shown in FIGS. 5-7, in one implementation the length of the stub chamber 50 along the x-axis is less than the length of the vertical input channel 30 along the x-axis. In addition, the length of the stub chamber 50 in the x-axis direction is less than the total length of the bend transition chamber 36. The length of the stub chamber 50, however, can be adjusted and tuned for different radar applications utilizing different RF wavelengths. Alternatively, in some embodiments the length of the stub chamber 50 in the x-axis direction can fully extend to be the same as the length of the vertical input channel 30 in the x-axis direction and to be the full length of the bend transition chamber 36.

With reference to FIG. 5, a perspective view of the vertical input channel 30, bend transition chamber 36, and the horizontal waveguide channel 42 is shown in a model format with sharp edges and corners and without fillets. With reference to FIG. 7, a top view of the bend transition chamber 36, stub chamber, and bumpouts 52 is shown in a model format with sharp edges and corners and without fillets.

With reference to FIG. 6, in practice the upper and lower waveguide parts 20, 22 can be manufactured as molded parts. As such, to facilitate manufacturing as molded parts, the various channels and chambers can be manufactured with rounded edges, fillets, and with a taper in the sidewalls. In this way, the parts can be more easily removed from the molds during the molding process. As shown in FIG. 6, the components of FIG. 5 are shown except with rounded edges and fillets, as required for the molding manufacturing process. As such, FIG. 6 provides a perspective view of the vertical input channel 30, bend transition chamber 36, and the horizontal waveguide channel 42 shown with rounded edges and corners and with fillets and tapering of the sidewalls of the vertical input channel 30, the bend transition chamber 36, and the horizontal waveguide channel 42.

The radar system 10 of the present disclosure, having a bend transition chamber 36 with stub chamber 50 and bumpouts 52 in opposing walls of the bend transition chamber 36, provides improved performance characteristics as compared with prior systems. In particular, the radar system 10 of the present disclosure provides higher RF power transmitted via the vertical input channel 30, as compared with prior vehicle radar systems that use the right-angle bend configurations shown, for example, in FIGS. 11A to 11D.

Figure 8:
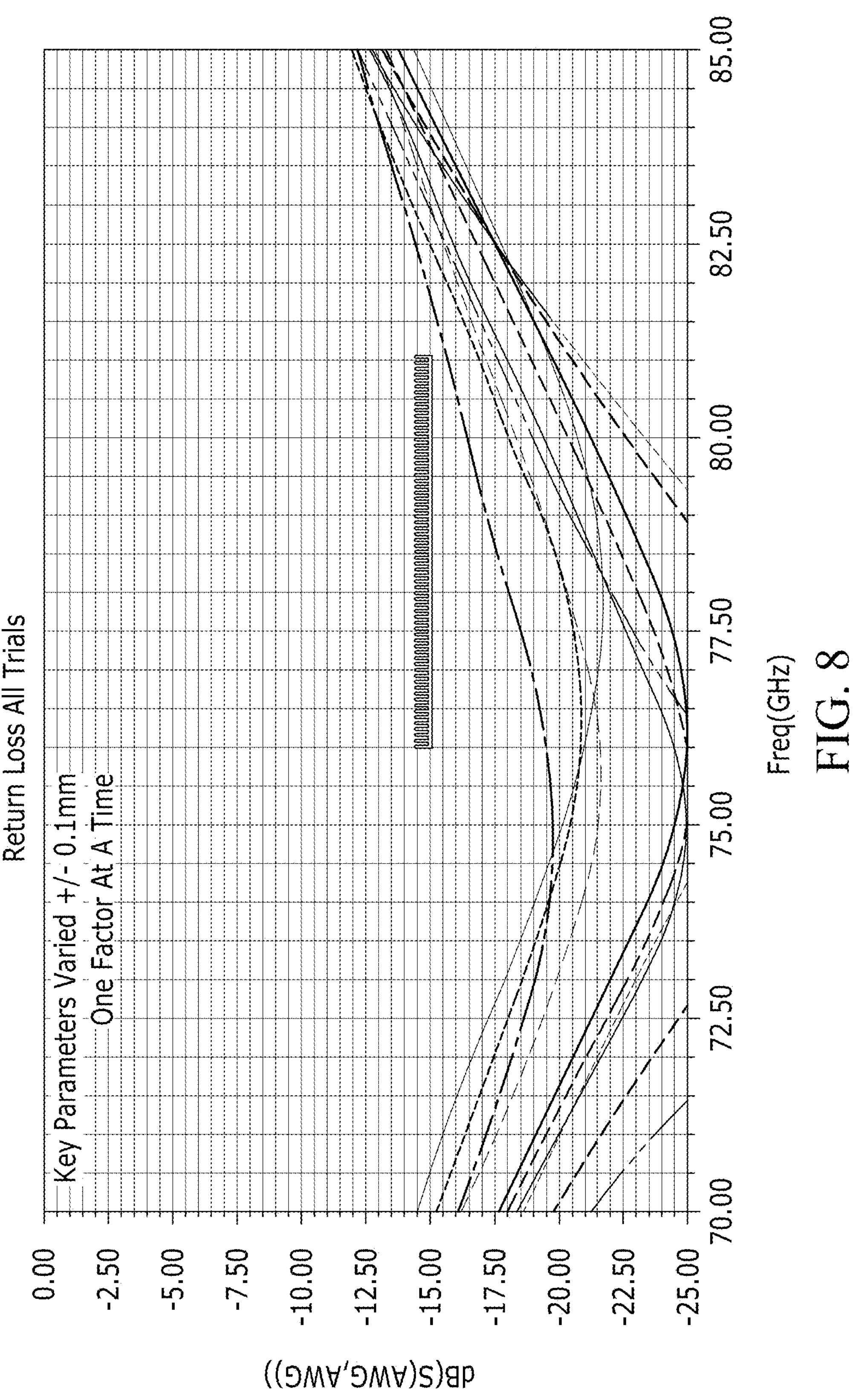
FIG. 8 is a graph illustrating return loss of radar systems configured with a bend transition chamber in accordance with the present disclosure.

With reference to FIG. 8, a performance graph illustrating return loss simulation results across a range of fabrication tolerances of a representative bend transition chamber 36 having a stub chamber 50 in accordance with the present disclosure is shown. The indicated return loss corresponds to an amount of return loss of RF power through the bend transition chamber 36 from the vertical input channel 30 to the horizontal waveguide channel 42. In FIG. 8, return loss in decibels (dB) is shown on the vertical axis, with lower return loss representing better performance with a better transfer of RF power from the vertical input channel 30 to the horizontal waveguide channel 42. The tested frequencies for the simulations are shown in gigahertz (GHz) along the horizontal axis. Automotive radar systems can generally utilize frequencies in the range of 76 to 81 GHz. Prior solutions that are symmetric have difficulty reaching a return loss of −15.00 dB and, even if a prior system were tested as having a return loss of −15.00 dB, in practice with manufacturing variances the resulting maximum return loss for most systems was closer to −10.00 dB.

As shown in FIG. 8, with radar system in accordance with the present disclosure, the return loss is well below −15.0 dB in the range of 76 to 81 GHz for all simulation configurations. The different return loss curves illustrated in FIG. 8 represent configurations using component parts with different manufacturing variances, such as gaps, sizes, and offsets, within tolerances, between the upper and lower waveguide parts 20, 22. In this way, radar systems in accordance with the present disclosure configured with a bend transition chamber 36 having a stub chamber 50 exhibit decreased return loss, increased performance, and a better transfer of RF power from the vertical input channel 30 to the horizontal waveguide channel 42, as compared with prior systems.

Figure 9:
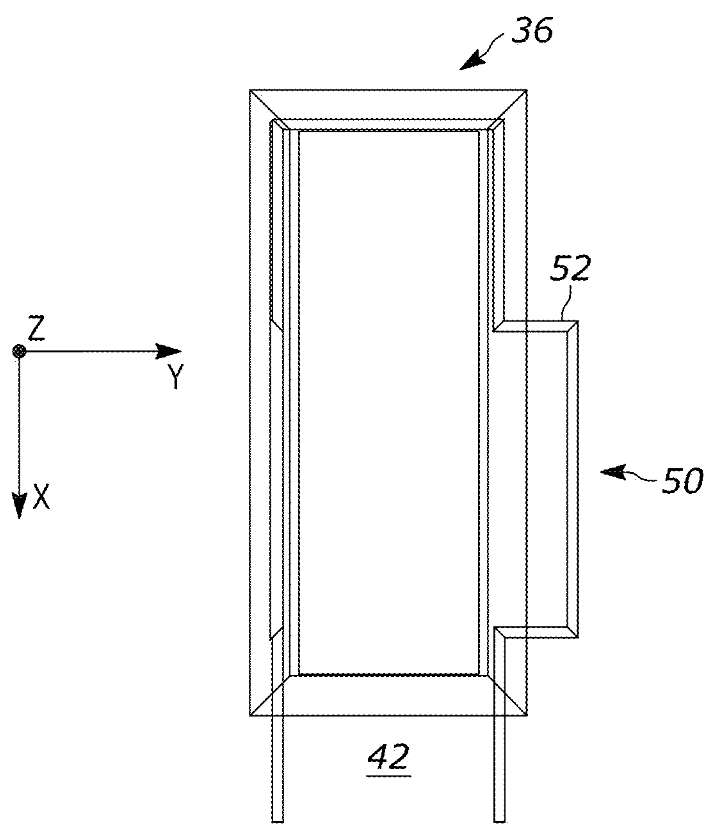
FIG. 9 is a top view of another embodiment of a bend transition chamber of a waveguide antenna in accordance with the present disclosure.
Figure 10:
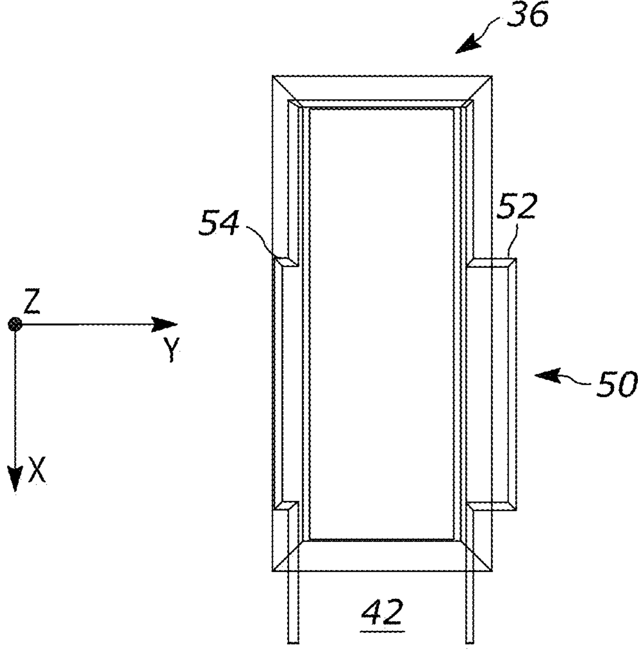
FIG. 10 is a top view of another embodiment of a bend transition chamber of a waveguide antenna in accordance with the present disclosure.
Figure 11A:
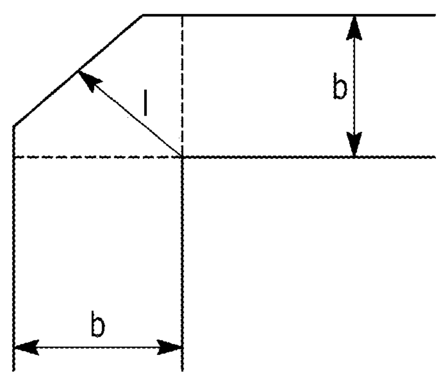
FIGS. 11A to 11D illustrate prior systems for routing RF signals from a vertical input channel to a horizontal waveguide channel.
Figure 11B:
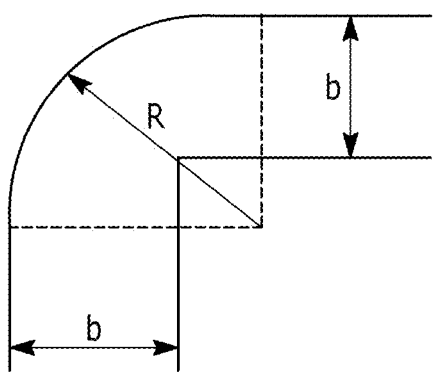
Figure 11C:
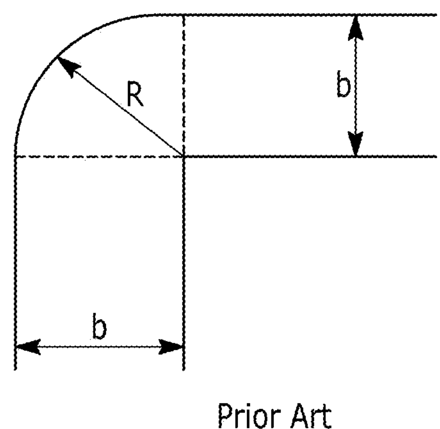
Figure 11D:
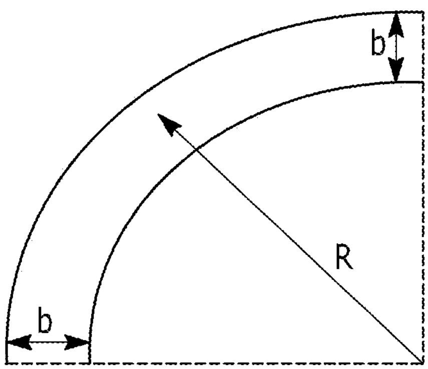
Figure 12:
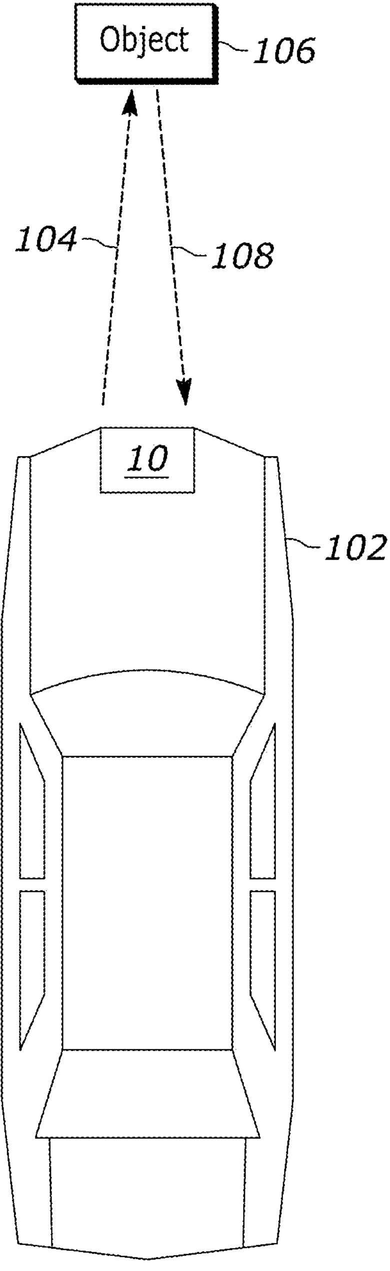
FIG. 12 illustrates a vehicle having a radar system in accordance with the present disclosure.

The above embodiments of the present disclosure include a stub chamber 50 with bumpouts 52 of equal size on either side of the stub chamber 50. In an alternative embodiment shown in FIG. 9, the bend transition chamber 36 can be configured with a stub chamber having a bumpout 52 on only one side of the bend transition chamber 36. Additionally, in another alternative embodiment shown in FIG. 10, the bumpouts can have different sizes on either side of the stub chamber 50. As shown in FIG. 10, one side of the stub chamber 50 includes bumpout 52 while the opposing side includes a smaller bumpout 54.

The foregoing description of the embodiments has been provided for purposes of illustration and description and is not intended to be exhaustive or to limit the disclosure. Individual elements or features of a particular embodiment are generally not limited to that particular embodiment, but, where applicable, are interchangeable and can be used in another embodiment, even if not specifically shown or described. The various embodiments may also be varied in many ways. Such variations are not to be regarded as a departure from the disclosure, and all such modifications are intended to be included within the scope of the disclosure. Although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Example embodiments are provided so that this disclosure will be thorough and will fully convey the scope to those who are skilled in the art. Specific details are set forth, including examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements.

The phrase "at least one of A, B, and C" should be construed to mean a logical (A OR B OR C), using a non-exclusive logical OR, and should not be construed to mean "at least one of A, at least one of B, and at least one of C." The term "set" does not necessarily exclude the empty set. The term "non-empty set" may be used to indicate exclusion of the empty set. The term "subset" does not necessarily require a proper subset. In other words, a first subset of a first set may be coextensive with (equal to) the first set.

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

What is claimed is:

1. A radio frequency (RF) system comprising:

a control printed circuit board (PCB) that includes a processor and a transmitter configured to generate RF signals; and a waveguide antenna attached to the control printed circuit board, the waveguide antenna including an input channel, a bend transition chamber, a waveguide channel, and a radiator, the input channel being configured to receive the RF signals from the control PCB along a first axis, the bend transition chamber being configured to receive the RF signals from the input channel and to route the RF signals to the waveguide channel, the waveguide channel being configured to receive the RF signals from the bend transition chamber along a second axis orthogonal to the first axis and to route the RF signals to the radiator, and the radiator being configured to transmit the RF signals outside of the RF system;

wherein:

the bend transition chamber includes a stub chamber having a width along a third axis orthogonal to both the first axis and the second axis that is greater than a width of the input channel along the third axis and greater than a width of the waveguide channel along the third axis;

the waveguide antenna includes an upper waveguide part and a lower waveguide part that are each formed by a molding process;

the upper waveguide part includes an upper chamber and the lower waveguide part includes a lower chamber such that the bend transition chamber is formed by the upper and lower chambers when the upper and lower waveguide parts are assembled together; and the upper and lower chambers are symmetrical along a plane formed by the second and third axes.

2. The RF system of claim 1, wherein the upper waveguide part includes an upper waveguide portion and the lower waveguide part includes a lower waveguide portion such that the waveguide channel is formed by the upper and lower waveguide portions when the upper and lower waveguide parts are assembled together.

3. The RF system of claim 2, wherein the upper and lower waveguide portions are symmetrical along a plane formed by the second and third axes.

4. The RF system of claim 1, wherein the upper and lower waveguide parts are assembled together in the RF system without conductive paste and without solder.

5. The RF system of claim 1, wherein the stub chamber includes a first bumpout that extends from a first sidewall of the bend transition chamber along the third axis and a second bumpout that extends from a second sidewall, opposite from the first sidewall, of the bend transition chamber.

6. The RF system of claim 5, wherein the first and second bumpouts extend from the first and second sidewalls, respectively, by an equal distance.

7. The RF system of claim 5, wherein the first and second bumpouts extend from the first and second sidewalls, respectively, by different distances.

8. The RF system of claim 1, wherein the stub chamber includes only a bumpout that extends from a first sidewall of the bend transition chamber along the third axis and a second sidewall, opposite from the first sidewall, does not include a bumpout.

9. An automotive radar system including the RF system of claim 1, the automotive radar system being configured to transmit and receive radar signals.

10. A radio frequency (RF) system comprising:

a control printed circuit board (PCB) that includes a processor and a transmitter configured to generate RF signals; and a waveguide antenna attached to the control printed circuit board, the waveguide antenna including an input channel, a bend transition chamber, a waveguide channel, and a radiator, the input channel being configured to receive the RF signals from the control PCB along a first axis, the bend transition chamber being configured to receive the RF signals from the input channel and to route the RF signals to the waveguide channel, the waveguide channel being configured to receive the RF signals from the bend transition chamber along a second axis orthogonal to the first axis and to route the RF signals to the radiator, and the radiator being configured to transmit the RF signals outside of the RF system;

wherein:

the bend transition chamber includes a stub chamber having a width along a third axis orthogonal to both the first axis and the second axis that is greater than a width of the input channel along the third axis and greater than a width of the waveguide channel along the third axis;

the waveguide antenna includes an upper waveguide part and a lower waveguide part that are each formed by a molding process;

the upper waveguide part includes an upper chamber and the lower waveguide part includes a lower chamber such that the bend transition chamber is formed by the upper and lower chambers when the upper and lower waveguide parts are assembled together;

the upper waveguide part includes an upper waveguide portion and the lower waveguide part includes a lower waveguide portion such that the waveguide channel is formed by the upper and lower waveguide portions when the upper and lower waveguide parts are assembled together; and the upper and lower waveguide parts are symmetrical along a plane formed by the second and third axes and assembled together in the RF system without conductive paste and without solder.

11. The RF system of claim 10, wherein the stub chamber includes a bumpout that extends from a sidewall of the bend transition chamber along the third axis.

12. The RF system of claim 10, wherein the stub chamber includes a first bumpout that extends from a first sidewall of the bend transition chamber along the third axis and a second bumpout that extends from a second sidewall, opposite from the first sidewall, of the bend transition chamber, with the first and second bumpouts extending from the first and second sidewalls, respectively, by an equal distance.

* * * * *